(12) United States Patent
Park et al.

(10) Patent No.: US 11,221,374 B2
(45) Date of Patent: Jan. 11, 2022

(54) METHOD FOR CHECKING DEFECTS IN LITHIUM ION SECONDARY BATTERY AND LITHIUM ION SECONDARY BATTERY MANUFACTURED THEREBY

(71) Applicants: HYUNDAI MOTOR COMPANY, Seoul (KR); KIA MOTORS CORPORATION, Seoul (KR)

(72) Inventors: Sang Mok Park, Gwangju-si (KR); Young Woo Lee, Suwon-si (KR); Ik Kyu Kim, Gwangmyeong-si (KR); Sung Ho Ban, Hwaseong-si (KR); Yoon Ji Lee, Bucheon-si (KR); Jung Young Cho, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 59 days.

(21) Appl. No.: 16/837,116

(22) Filed: Apr. 1, 2020

(65) Prior Publication Data
US 2021/0156925 A1     May 27, 2021

(30) Foreign Application Priority Data
Nov. 27, 2019   (KR) .......... 10-2019-0154790

(51) Int. Cl.
*G01R 31/392* (2019.01)
*H01M 10/42* (2006.01)
(Continued)

(52) U.S. Cl.
CPC ......... *G01R 31/392* (2019.01); *G01R 31/389* (2019.01); *H01M 10/0525* (2013.01); *H01M 10/4285* (2013.01)

(58) Field of Classification Search
CPC .............. G01R 31/392; G01R 31/389; H01M 10/0525; H01M 10/4285; H01M 10/049;
(Continued)

(56) References Cited

U.S. PATENT DOCUMENTS

| 5,675,234 A | * | 10/1997 | Greene | ................. | H01M 10/44 340/636.11 |
| 2019/0074538 A1 | * | 3/2019 | Lee | ..................... | H01M 10/049 |

FOREIGN PATENT DOCUMENTS

| KR | 10-1471775 B1 | 12/2014 |
| KR | 10-1629482 B1 | 6/2016 |
| KR | 10-1837586 B1 | 3/2018 |

* cited by examiner

*Primary Examiner* — Douglas X Rodriguez
*Assistant Examiner* — Trung Q Nguyen
(74) *Attorney, Agent, or Firm* — McDonnell Boehnen Hulbert & Berghoff LLP

(57) ABSTRACT

A method for checking defects in a lithium ion secondary battery includes primarily charging and degassing the lithium ion secondary battery after manufacture of the secondary battery, secondarily charging and discharging the secondary battery and then measuring one or more of OCVs and IRs of lithium ion secondary battery cells; pressurizing and aging the secondary battery by aging the secondary battery in a state in which a pressure of a designated magnitude or more is applied to the secondary battery, and checking whether or not the secondary battery cells are defective by re-measuring the one or more of OCVs and IRs of the secondary battery cells and then comparing the re-measured one or more of the OCVs and the IRs to the previously measured one or more of the OCVs and the IRs.

13 Claims, 4 Drawing Sheets

(51) Int. Cl.
*G01R 31/389* (2019.01)
*H01M 10/0525* (2010.01)
(58) Field of Classification Search
CPC ........... H01M 10/0567; H01M 4/0447; H01M 10/058; H01M 10/4235; H01M 4/625; H01M 10/446; B82Y 40/00; B82Y 30/00; Y02E 60/10
USPC ............... 324/200, 207.11–207.19, 219–241, 324/425–437, 443–447, 500, 515, 529, 324/530, 750.06
See application file for complete search history.

METHOD FOR CHECKING DEFECTS IN LITHIUM ION SECONDARY BATTERY AND LITHIUM ION SECONDARY BATTERY MANUFACTURED THEREBY

CROSS-REFERENCE TO RELATED APPLICATION

This application claims the priority benefit of Korean Patent Application No. 10-2019-0154790, filed on Nov. 27, 2019 in the Korean Intellectual Property Office, the disclosure of which is incorporated herein by reference.

BACKGROUND

1. Field

The present disclosure relates to a method for checking defects in a lithium ion secondary battery and a lithium ion secondary battery manufactured thereby and, more particularly, to a method for checking defects in a lithium ion secondary battery in which inner fine short circuit defect discrimination of the lithium ion secondary battery may be improved during an aging process among manufacturing processes of the lithium ion secondary battery, and a lithium ion secondary battery manufactured thereby.

2. Description of the Related Art

Recently, in order to cope with atmospheric pollution or global warming, carbon dioxide reduction is required. It is expected that carbon dioxide emissions will be reduced due to introduction of electric vehicles or hybrid electric vehicles in the automobile industry, and lithium ion secondary batteries for driving a motor, which hold the key to commercialization of these vehicles, are vigorously under development.

Checking of inner short circuit defects in a lithium ion secondary battery is performed during a formation process of the lithium ion secondary battery. In general, the defects in the secondary battery are checked based on open circuit voltage (OCV) or internal resistance (IR) after charging/discharging of the secondary battery after manufacture of the secondary battery, OCV or IR after aging, a difference between OCVs or IRs before and after aging, or a change in OCV per unit time of aging. Here, in order to increase defect discrimination of the secondary battery, various methods, such as increasing of an aging time or temperature, adding of a separate process of repeating charging/discharging to the formation process, etc., were used.

However, in spite of research and development to minimize defect outflow by strengthening conditions for checking defects, problems, such as emergence of a cell having OCV which is abnormally reduced, frequently occur on the real market. Therefore, technology which may improve defect discrimination of secondary batteries is desired.

SUMMARY

Therefore, the present disclosure has been made in view of the above problems, and it is an object of the present disclosure to provide a method for checking defects in a lithium ion secondary battery in which inner fine short circuit defect discrimination of the lithium ion secondary battery may be improved by performing aging under the condition that a pressure of a designated magnitude or more is applied to the lithium ion secondary battery during an aging process among manufacturing processes of the lithium ion secondary battery, and a lithium ion secondary battery manufactured thereby.

In accordance with an aspect of the present disclosure, the above and other objects can be accomplished by the provision of a method for checking defects in a lithium ion secondary battery, the method configured to check inner fine short circuit defects in the lithium ion secondary battery during an aging process among manufacturing processes of the lithium ion secondary battery, the method including primarily charging and degassing the lithium ion secondary battery after manufacture of the lithium ion secondary battery, secondarily charging and discharging the lithium ion secondary battery and then measuring one or more of open circuit voltages (OCVs) and internal resistances (IRs) of lithium ion secondary battery cells, pressurizing and aging the lithium ion secondary battery by aging the lithium ion secondary battery in a state in which a pressure of a designated magnitude or more is applied to the lithium ion secondary battery, and checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs.

In the pressurizing and aging the lithium ion secondary battery, the pressure applied to the lithium ion secondary battery may be 0.2-5 $kg/cm^2$.

In the pressurizing and aging the lithium ion secondary battery, a temperature of the lithium ion secondary battery may be raised to 45° C. to 60° C.

In the pressurizing and aging the lithium ion secondary battery, the lithium ion secondary battery may be placed between two pressure plates configured to be spaced apart from each other by a designated distance, and then be pressurized by moving the respective pressure plates in directions toward each other.

In the pressurizing and aging the lithium ion secondary battery, the lithium ion secondary battery may be accommodated in a pressure chamber, and then be pressurized by raising a pressure of gas in the pressure chamber.

In the checking whether or not the lithium ion secondary battery cells are defective, when a difference between the OCV of a lithium ion secondary battery cell measured before aging and the OCV of the lithium ion secondary battery cell re-measured after aging deviates from a predetermined normal range, it may be determined that the lithium ion secondary battery cell is defective.

In the checking whether or not the lithium ion secondary battery cells are defective, when a difference between the IR of a lithium ion secondary battery cell measured before aging and the IR of the lithium ion secondary battery cell re-measured after aging deviates from a predetermined normal range, it may be determined that the lithium ion secondary battery cell is defective.

The method may further include, after the secondarily charging and discharging the lithium ion secondary battery and then the measuring the one or more of the open circuit voltages (OCVs) and the internal resistances (IRs) of the lithium ion secondary battery cells, re-measuring the one or more of the OCVs and the IRs of the lithium ion secondary battery cells while applying a designated pressure to the lithium ion secondary battery, deriving changes in the one or more of the OCVs and the IRs of the lithium ion secondary battery cells based on the previously measured one or more of the OCVs and the IRs and the re-measured one or more of the OCVs and the IRs, and checking whether or not the lithium ion secondary battery cells are defective based on the derived changes.

The method may further include, before the secondarily charging and discharging the lithium ion secondary battery, pressurizing the lithium ion secondary battery at a pressure of a designated magnitude or more.

In the checking whether or not the lithium ion secondary battery cells are defective based on the derived changes in the one or more of the OCVs and the IRs, when a difference between the derived change in the OCV of a lithium ion secondary battery cell and a predetermined OCV change deviates from a predetermined normal range, it may be determined that the lithium ion secondary battery cell is defective.

In the checking whether or not the lithium ion secondary battery cells are defective based on the derived changes in the one or more of the OCVs and the IRs, when a difference between the derived change in the IR of a lithium ion secondary battery cell and a predetermined IR change deviates from a predetermined normal range, it may be determined that the lithium ion secondary battery cell is defective.

In the checking whether or not the lithium ion secondary battery cells are defective based on the derived changes in the one or more of the OCVs and the IRs, when a difference between the derived change in the OCV of a lithium ion secondary battery cell and a predetermined OCV change and a difference between the derived change in the IR of the lithium ion secondary battery cell and a predetermined IR change respectively deviate from corresponding predetermined normal ranges, it may be determined that the lithium ion secondary battery cell is defective.

In the checking whether or not the lithium ion secondary battery cells are defective, when the OCV and the IR of a lithium ion secondary battery cell measured after the secondarily charging and discharging the lithium ion secondary battery respectively deviate from corresponding predetermined normal ranges, it may be determined that the lithium ion secondary battery cell is defective.

In accordance with another aspect of the present disclosure, there is provided a lithium ion secondary battery manufactured by the above method.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EXEMPLARY EMBODIMENTS

Figure 1:
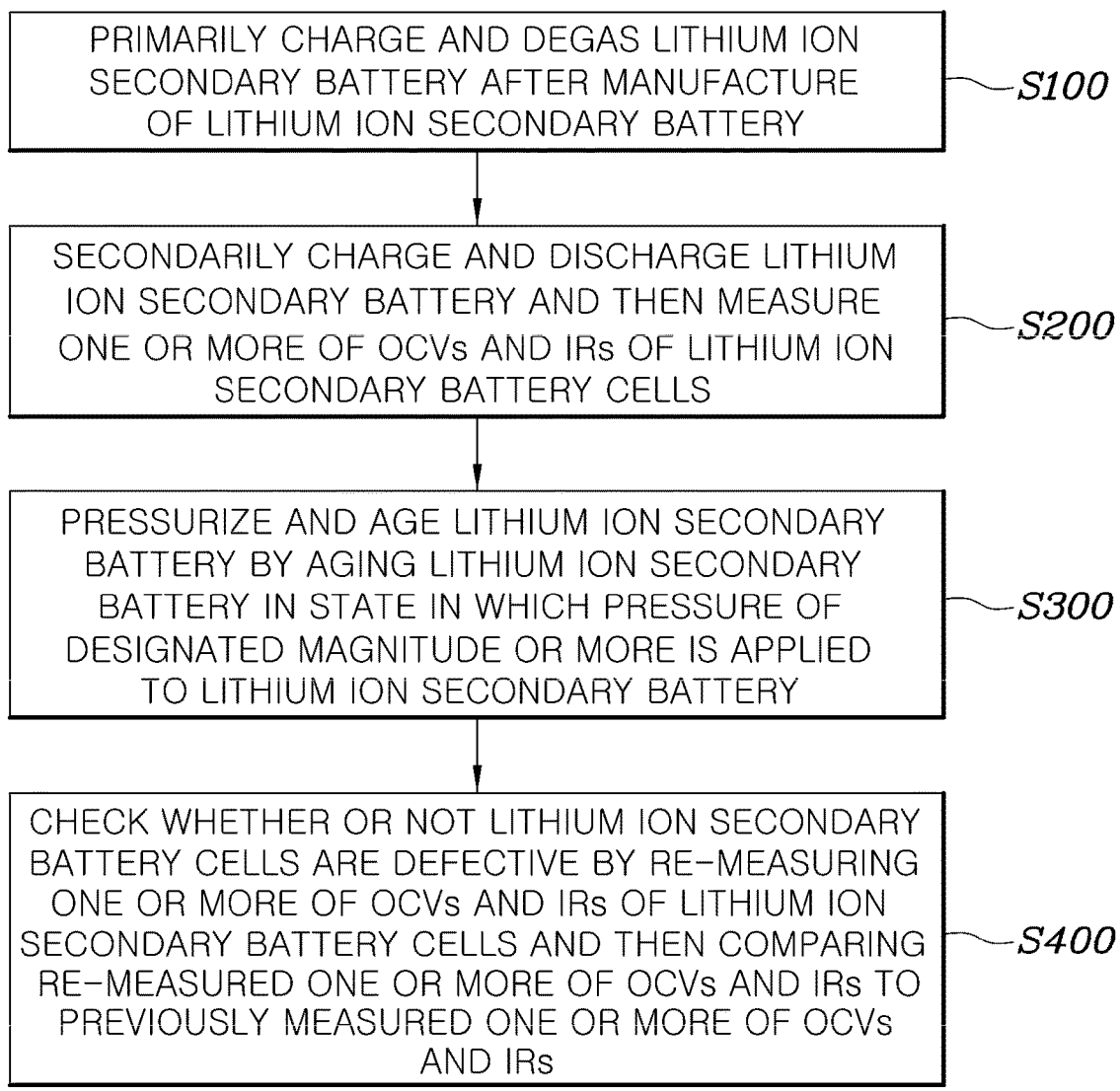
FIG. 1 is a flowchart representing a method for checking defects in a lithium ion secondary battery according to one embodiment of the present disclosure.

Reference will now be made in detail to the preferred embodiments of the present disclosure, examples of which are illustrated in the accompanying drawings. Terms or words used in the following description and claims are not restrictively interpreted as having usual or dictionary meanings, and will be interpreted as having meanings and concept coinciding with the technical scope of the disclosure based on a principle in which the inventor(s) of the disclosure can appropriately define the concept of a term so as to explain the disclosure in the best mode.

Therefore, the embodiments of the present disclosure and the elements illustrated in the drawings are provided only to completely disclose the disclosure but do not represent all of the technical scope of the disclosure, and thus it will be understood that various equivalent modifications which may replace the embodiments will become apparent to those skilled in the art at the time of application of the disclosure.

FIG. 1 is a flowchart representing a method for checking defects in a lithium ion secondary battery according to one embodiment of the present disclosure. The method according to one embodiment of the present disclosure is configured to check inner fine short circuit defects in the lithium ion secondary battery during an aging process among manufacturing processes of the lithium ion secondary battery, and the method may include, as shown in FIG. 1, primarily charging and degassing the lithium ion secondary battery after manufacture of the lithium ion secondary battery (S100), secondarily charging and discharging the lithium ion secondary battery and then measuring one or more of open circuit voltages (OCVs) and internal resistances (IRs) of lithium ion secondary battery cells (S200), pressurizing and aging the lithium ion secondary battery by aging the lithium ion secondary battery in a state in which a pressure of a designated magnitude or more is applied to the lithium ion secondary battery (S300), and checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs (S400).

In more detail, in primarily charging and degassing the lithium ion secondary battery after manufacture of the lithium ion secondary battery (S100), the manufactured lithium ion secondary battery may be preformed for the first time, i.e., be initially performed. Here, in initial charging, the lithium ion secondary battery may be charged to a predetermined state of charge (SOC). According to one embodiment, in initial charging, the lithium ion secondary battery may be charged to an SOC of 30%, but this value of the SOC is just one embodiment and the SOC may be set to other values.

Further, in primarily charging and degassing the lithium ion secondary battery (S100), degassing in which gas generated in the lithium ion secondary battery during primary charging is removed may be performed.

In secondarily charging and discharging the lithium ion secondary battery and then measuring the one or more of the open circuit voltages (OCVs) and the internal resistances (IRs) of the lithium ion secondary battery cells (S200), after degassing, the lithium ion secondary battery may be charged to an SOC of 100% and then the charge capacity of the lithium ion secondary battery may be measured, and the lithium ion secondary battery may be discharged to an SOC of 0% after confirming the charge capacity and then the discharge capacity of the lithium ion secondary battery may be measured. Further, after measuring the discharge capacity, a predetermined aging condition may be satisfied and then one or more of OCV or IR of the lithium ion secondary battery may be measured.

That is to say, in S200, the predetermined aging condition may be satisfied, and then OCV values of the lithium ion secondary battery cells or IR values of the lithium ion secondary battery cells may be measured in one embodiment, or both the OCV values and the IR values of the lithium ion secondary battery cells may be measured in another embodiment.

In pressurizing and aging the lithium ion secondary battery by aging the lithium ion secondary battery in the state in which the pressure of the designated magnitude or more is applied to the lithium ion secondary battery (S300), the pressure of the designated magnitude or more is applied to the lithium ion secondary battery. Here, the pressure applied to the lithium ion secondary battery may be 0.2-5 kg/cm$^2$. Further, in pressurizing and aging the lithium ion secondary battery (S300), the temperature of the lithium ion secondary battery may be raised to 40° C. to 60° C.

Figure 2:
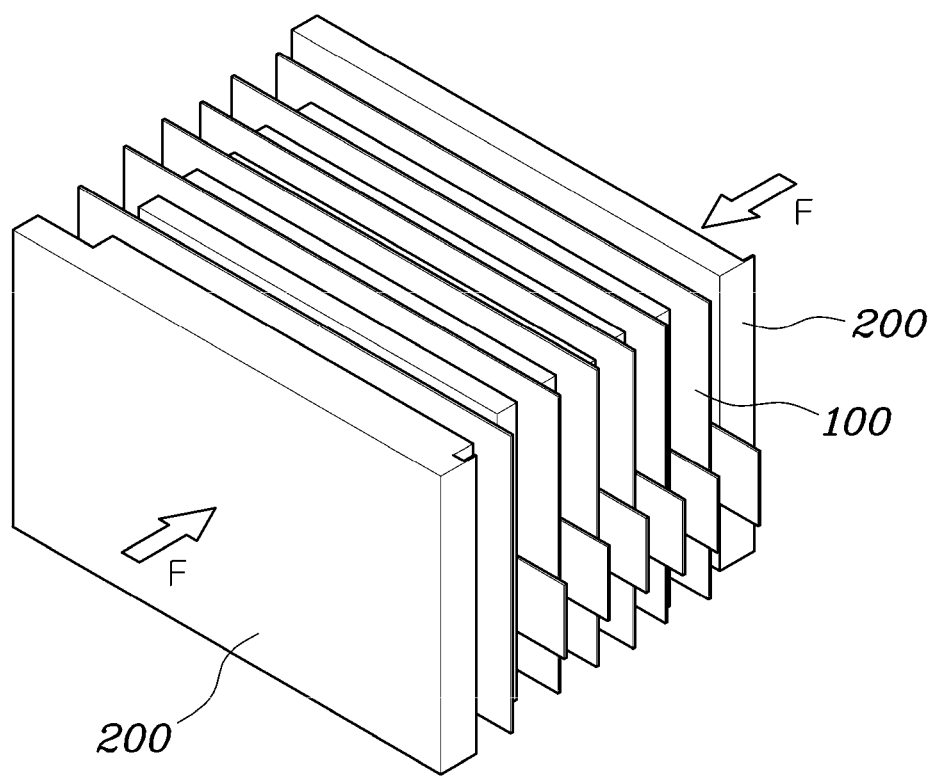
FIG. 2 is a view illustrating pressurization and aging of the lithium ion secondary battery in the method according to one embodiment of the present disclosure.

In more detail, referring to FIG. 2, according to one embodiment, in pressurizing and aging the lithium ion secondary battery (S300), the lithium ion secondary battery may be placed between two pressure plates 200, which are spaced apart from each other by a designated distance, and then be pressurized by moving the respective pressure plates 200 in directions toward each other. Although not shown in the figure, according to one embodiment, the pressure plates 200 may be driven by a cylinder or a motor so as to apply the pressure of 0.2-5 kg/cm$^2$ to the lithium ion secondary battery.

Figure 3:
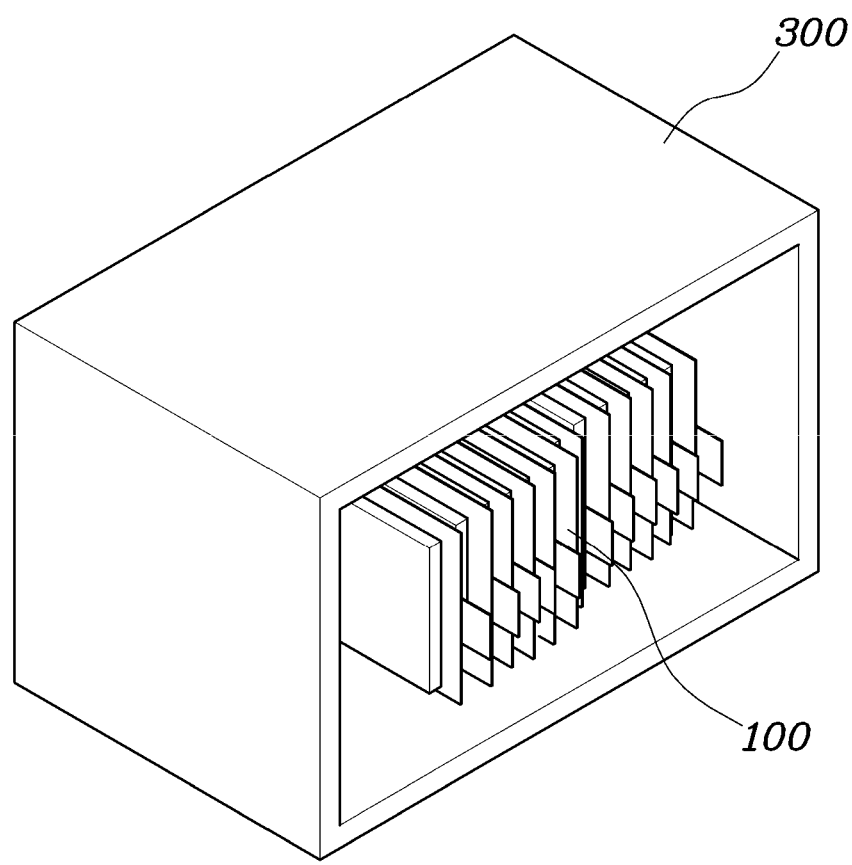
FIG. 3 is a view illustrating pressurization and aging of the lithium ion secondary battery in the method according to another embodiment of the present disclosure.

Further, referring to FIG. 3, according to another embodiment, in pressurizing and aging the lithium ion secondary battery (S300), the lithium ion secondary battery may be accommodated in in a pressure chamber 300, and then be pressurized by raising the pressure of gas in the pressure chamber 300.

However, the methods for pressurizing the lithium ion secondary battery shown in FIGS. 2 and 3 are only embodiments, and various other pressurizing methods in which a predetermined pressure may be applied to the lithium ion secondary battery during the aging process may be used in the present disclosure.

Pressure may be applied to the lithium ion secondary battery cells before or after secondary charging and discharging depending on pressurizing methods, and in this case, latent defective cells express defects, and thus, not only defect discrimination in subsequent processes may be raised but also gaps between a separator and electrodes and bending of the electrodes or creases on the electrodes may be minimized so as to minimize thickness dispersion of the cells, and reaction of the electrodes may be uniformly induced so as to improve characteristics of the cells.

According to one embodiment, in checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs (S400), when a difference between the OCV of a lithium ion secondary battery cell measured before aging and the OCV of the lithium ion secondary battery cell re-measured after aging deviates from a predetermined normal range, it may be determined that the lithium ion secondary battery cell is defective.

According to another embodiment, in checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs (S400), when a difference between the IR of a lithium ion secondary battery cell measured before aging and the IR of the lithium ion secondary battery cell re-measured after aging deviates from a predetermined normal range, it may be determined that the lithium ion secondary battery cell is defective.

According to yet another embodiment, in checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs (S400), when a difference between the OCV of a lithium ion secondary battery cell measured before aging and the OCV of the lithium ion secondary battery cell re-measured after aging and a difference between the IR of the lithium ion secondary battery cell measured before aging and the IR of the lithium ion secondary battery cell re-measured after aging respectively deviate from corresponding predetermined normal ranges, it may be determined that the lithium ion secondary battery cell is defective.

That is to say, in checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs (S400), differences between the OCV values of the lithium ion secondary battery cells measured in S200 and the OCV values of the lithium ion secondary battery cells measured in S400 and differences between the IR values of the lithium ion secondary battery cells measured in S200 and the IR values of the lithium ion secondary battery cells measured in S400 are calculated, and when the calculated differences between the OCV and IR values of a lithium ion secondary battery cell respectively deviate from the corresponding predetermine normal ranges, it may be determined that the lithium ion secondary battery cell is defective.

Figure 4:
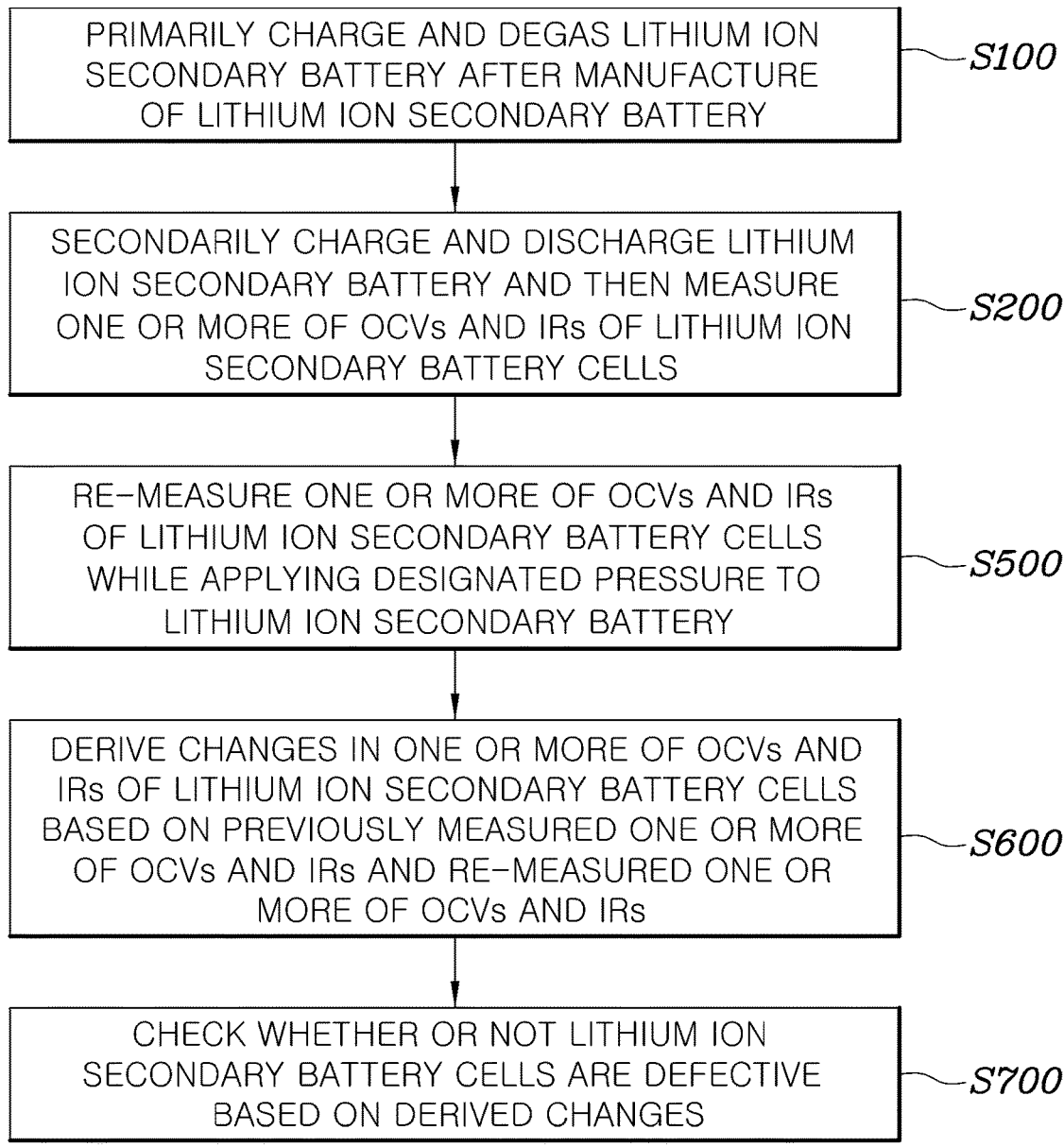
FIG. 4 is a flowchart representing a method for checking defects in a lithium ion secondary battery according to another embodiment of the present disclosure.

FIG. 4 is a flowchart representing a method for checking defects in a lithium ion secondary battery according to another embodiment of the present disclosure. Referring to FIG. 4, the method according to another embodiment of the present disclosure is configured to check inner fine short circuit defects in the lithium ion secondary battery during an aging process among manufacturing processes of the lithium ion secondary battery, and the method may further include, after primarily charging and degassing the lithium ion secondary battery after manufacture of the lithium ion secondary battery (S100) and secondarily charging and discharging the lithium ion secondary battery and then measuring one or more of open circuit voltages (OCV) and internal resistances (IR) of lithium ion secondary battery cells (S200), re-measuring the one or more of the OCVs and the IRs of the lithium ion secondary battery cells while applying a designated pressure to the lithium ion secondary battery (S500), deriving changes in the one or more of the OCVs and the IRs of the lithium ion secondary battery cells based on the previously measured one or more of the OCVs and the IRs and the re-measured one or more of the OCVs and the IRs (S600), and checking whether or not the lithium ion secondary battery cells are defective based on the derived changes (S700).

In more detail, in checking whether or not the lithium ion secondary battery cells are defective based on the derived changes in the one or more of the OCVs and the IRs (S700), according to one embodiment, when a difference between the derived change in the OCV of a lithium ion secondary battery cell and a predetermined OCV change deviates from a predetermined normal range, it may be determined that the lithium ion secondary battery cell is defective.

In addition, in checking whether or not the lithium ion secondary battery cells are defective based on the derived changes in the one or more of the OCVs and the IRs (S700), according to another embodiment, when a difference between the derived change in the IR of a lithium ion secondary battery cell and a predetermined IR change deviates from a predetermined normal range, it may be determined that the lithium ion secondary battery cell is defective.

Further, in checking whether or not the lithium ion secondary battery cells are defective based on the derived changes in the one or more of the OCVs and the IRs (S700), according to yet another embodiment, when a difference between the derived change in the OCV of a lithium ion secondary battery and the predetermined OCV change and a difference between the derived change in the IR of the lithium ion secondary battery and the predetermined IR change deviate from the corresponding predetermined normal ranges, it may be determined that the lithium ion secondary battery cell is defective.

That is to say, in checking whether or not the lithium ion secondary battery cells are defective based on the derived changes in the one or more of the OCVs and the IRs (S700), when the change in the one or more of the OCV and the IR of a lithium ion secondary battery cell derived in S600 based on the one or more of the OCVs and the IRs, which is measured in S200, and the one or more of the OCVs and the IRs, which is re-measured in S500, deviates from a change within the predetermined normal range, it may be determined that the lithium ion secondary battery cell is defective.

Reasons why the lithium ion secondary battery is aged in the state in which pressure is applied to the lithium ion secondary battery during the aging process are as follows.

During conventional lithium ion secondary battery manufacturing processes, aging was performed so as to stabilize a film of the lithium ion secondary battery to stabilize cell performance, and to check defective cells based on measured OCVs and IRs. However, the conventional aging process was limited in that an inner short circuit defect caused by high-resistance protruding particles or an inner short circuit defect caused by growth-type particles which are grown over time cannot be checked, and in order to detect this defect, an aging process time must be increased.

In order to solve the above problems, the method according to the present disclosure ages a lithium ion secondary battery while applying a pressure of a designated magnitude or more to the lithium ion secondary battery during the aging process, and thus checks an inner short circuit defect caused by high-resistance protruding particles or an inner short circuit defect caused by growth-type particles which are grown over time, thereby being capable of improving defect discrimination of the lithium ion secondary battery and shortening an aging time.

In more detail, in case of the high-resistance protruding particles, when a pressure of a designated magnitude or more is applied to the lithium ion secondary battery, contact resistance is reduced and a short circuit may be caused within a shorter time, and thus, a change in OCV may rapidly take place and accordingly a short circuit defect may be checked within a shorter aging process time.

In addition, in the growth-type particles located between an anode and a cathode, the corresponding particles are grown over time, connect the anode and the cathode and thus cause a short circuit, and when the pressure of the designated magnitude or more is applied to the lithium ion secondary battery as in the present disclosure, a distance between the anode and the cathode is decreased, and thus, even at a point in time when the growth-type particles are sufficiently grown, a short circuit between the anode and the cathode may be caused by the growth-type particles, and thereby, a short circuit defect may be checked within a shorter aging process time.

Further, it was difficult to check a defect, caused by particles connecting the anode and the cathode only in the state in which pressure is applied to the lithium ion secondary battery, through the conventional pressureless aging process, but the method according to the present disclosure may increase discrimination of a defect caused by the particles connecting the anode and the cathode only in the state in which pressure is applied to the lithium ion secondary battery.

Also, by applying the pressure of the designated magnitude or more to the lithium ion secondary battery, if the lithium ion secondary battery has an abnormal coupling state between inner parts or an abnormal physical coupling state (poor tap welding, a base material crack, a tap crack, etc.), the state of a coupling part is changed, and thus, defect discrimination may be improved based on the corresponding change as compared to the conventional method.

A lithium ion secondary battery manufactured by the method according to the present disclosure is manufactured through improved defect discrimination, and may thus have improved cell stability and commercial value.

As is apparent from the above description, a method for checking defects in a lithium ion secondary battery according to the present disclosure may improve discrimination of a short circuit defect caused by particles connecting an anode and a cathode only in the state in which pressure is applied to the lithium ion secondary battery.

In addition, the method according to the present disclosure may improve discrimination of a short circuit defect caused by high-resistance protruding particles or growth-type particles.

Further, the method according to the present disclosure may shorten an aging period and thus reduce process costs, and may minimize defect outflow to the market and thus improve the commercial value of the lithium ion secondary battery.

Although the exemplary embodiments of the present disclosure have been disclosed for illustrative purposes, those skilled in the art will appreciate that various modifications, additions and substitutions are possible, without departing from the scope and spirit of the disclosure as disclosed in the accompanying claims.

The invention claimed is:

1. A method for checking defects in a lithium ion secondary battery, the method configured to check inner fine short circuit defects in the lithium ion secondary battery during an aging process among manufacturing processes of the lithium ion secondary battery, the method comprising:
primarily charging and degassing the lithium ion secondary battery after manufacture of the lithium ion secondary battery;
secondarily charging and discharging the lithium ion secondary battery and then measuring one or more of open circuit voltages (OCVs) and internal resistances (IRs) of lithium ion secondary battery cells;

pressurizing and aging the lithium ion secondary battery by aging the lithium ion secondary battery in a state in which a pressure of a designated magnitude or more is applied to the lithium ion secondary battery;

checking whether or not the lithium ion secondary battery cells are defective by re-measuring the one or more of the OCVs and the IRs of the lithium ion secondary battery cells and then comparing the re-measured one or more of the OCVs and the IRs to the previously measured one or more of the OCVs and the IRs;

after secondarily charging and discharging the lithium ion secondary battery and then measuring the one or more of the open circuit voltages (OCVs) and the internal resistances (IRs) of the lithium ion secondary battery cells:

re-measuring the one or more of the OCVs and the IRs of the lithium ion secondary battery cells while applying a designated pressure to the lithium ion secondary battery;

deriving changes in the one or more of the OCVs and the IRs of the lithium ion secondary battery cells based on the previously measured one or more of the OCVs and the IRs and the re-measured one or more of the OCVs and the IRs; and checking whether or not the lithium ion secondary battery cells are defective based on the derived changes.

2. The method according to claim 1, wherein, in the pressurizing and aging the lithium ion secondary battery, the pressure applied to the lithium ion secondary battery is 0.2-5 kg/cm$^2$.

3. The method according to claim 1, wherein, in the pressurizing and aging the lithium ion secondary battery, a temperature of the lithium ion secondary battery is raised to 45° C. to 60° C.

4. The method according to claim 1, wherein, in the pressurizing and aging the lithium ion secondary battery, the lithium ion secondary battery is placed between two pressure plates configured to be spaced apart from each other by a designated distance, and is then pressurized by moving the respective pressure plates in directions toward each other.

5. The method according to claim 1, wherein, in the pressurizing and aging the lithium ion secondary battery, the lithium ion secondary battery is accommodated in a pressure chamber, and is then pressurized by raising a pressure of gas in the pressure chamber.

6. The method according to claim 1, wherein, in the checking whether or not the lithium ion secondary battery cells are defective, when a difference between the OCV of a lithium ion secondary battery cell measured before aging and the OCV of the lithium ion secondary battery cell re-measured after aging deviates from a predetermined normal range, it is determined that the lithium ion secondary battery cell is defective.

7. The method according to claim 1, wherein, in the checking whether or not the lithium ion secondary battery cells are defective, when a difference between the IR of a lithium ion secondary battery cell measured before aging and the IR of the lithium ion secondary battery cell re-measured after aging deviates from a predetermined normal range, it is determined that the lithium ion secondary battery cell is defective.

8. The method according to claim 1, further comprising, before the secondarily charging and discharging the lithium ion secondary battery:

pressurizing the lithium ion secondary battery at a pressure of a designated magnitude or more.

9. The method according to claim 1, wherein, in the checking whether or not the lithium ion secondary battery cells are defective based on the derived changes in the one or more of the OCVs and the IRs, when a difference between the derived change in the OCV of a lithium ion secondary battery cell and a predetermined OCV change deviates from a predetermined normal range, it is determined that the lithium ion secondary battery cell is defective.

10. The method according to claim 1, wherein, in the checking whether or not the lithium ion secondary battery cells are defective based on the derived changes in the one or more of the OCVs and the IRs, when a difference between the derived change in the IR of a lithium ion secondary battery cell and a predetermined IR change deviates from a predetermined normal range, it is determined that the lithium ion secondary battery cell is defective.

11. The method according to claim 1, wherein, in the checking whether or not the lithium ion secondary battery cells are defective based on the derived changes in the one or more of the OCVs and the IRs, when a difference between the derived change in the OCV of a lithium ion secondary battery cell and a predetermined OCV change and a difference between the derived change in the IR of the lithium ion secondary battery cell and a predetermined IR change respectively deviate from corresponding predetermined normal ranges, it is determined that the lithium ion secondary battery cell is defective.

12. The method according to claim 1, wherein, in the checking whether or not the lithium ion secondary battery cells are defective, when the OCV and the IR of a lithium ion secondary battery cell measured after the secondarily charging and discharging the lithium ion secondary battery respectively deviate from corresponding predetermined normal ranges, it is determined that the lithium ion secondary battery cell is defective.

13. A lithium ion secondary battery manufactured by the method according to claim 1.

* * * * *